(12) United States Patent
Tsironis

(10) Patent No.: US 11,616,281 B1
(45) Date of Patent: Mar. 28, 2023

(54) TWO PROBE WAVEGUIDE TUNER

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 11 days.

(21) Appl. No.: 17/511,867

(22) Filed: Oct. 27, 2021

(51) Int. Cl.
*H03H 7/40* (2006.01)
*H01P 5/04* (2006.01)
*H01P 5/16* (2006.01)
*H01P 3/12* (2006.01)

(52) U.S. Cl.
CPC .................. *H01P 5/04* (2013.01); *H01P 3/12* (2013.01); *H01P 5/16* (2013.01); *H03H 7/40* (2013.01)

(58) Field of Classification Search
CPC .. H01P 1/207; H01P 1/222; H01P 1/00; H01P 5/04; H01P 5/00; H01P 5/16; H01P 3/00; H01P 3/12; H01P 3/023; H01P 7/06; H03H 7/38; H03H 7/40; G01R 27/04
USPC ......................................................... 333/263
See application file for complete search history.

(56) References Cited

U.S. PATENT DOCUMENTS

| | | | | |
|---|---|---|---|---|
| 3,386,054 A | * | 5/1968 | Spikula | H01P 1/165 333/248 |
| 3,697,902 A | * | 10/1972 | Louvel | H01P 5/04 333/33 |
| 5,910,754 A | | 6/1999 | Simpson et al. | |
| 6,674,293 B1 | | 1/2004 | Tsironis | |

OTHER PUBLICATIONS

"Load Pull Measurements" [online], Wikipedia [retrieved on Nov. 18, 2016] Retrieved from Internet <URL:http://en.wikipedia.org/wiki/Load_pull>.
W Band Programmable Tuner Model 11075, Product Note 43, 1997, Focus Microwaves.
"Signal-flow graph" [online], Wikipedia [retrieved on Aug. 31, 2021]. Retrieved from Internet <URL: https://en.wikipedia.org/wiki/Signal-flow_graph>.
"Linear Actuator" [online], Wikipedia [retrieved on Apr. 25, 2020]. Retrieved from Internet <URL: https://en.wikipedia.org/wiki/Linear_actuator>.

\* cited by examiner

*Primary Examiner* — Stephen E. Jones

(57) ABSTRACT

A new two-probe waveguide slide screw load-pull tuner of which the probes share the same waveguide section; they are inserted diametrically at fixed depth into facing each other slots on opposite broad walls of the waveguide. The tuner does not have cumbersome adjustable vertical axes controlling the penetration of the probes and its low profile is optimized for on-wafer operations. The carriages holding the probes are moved along the waveguide using electric stepper motors or linear actuators.

6 Claims, 9 Drawing Sheets

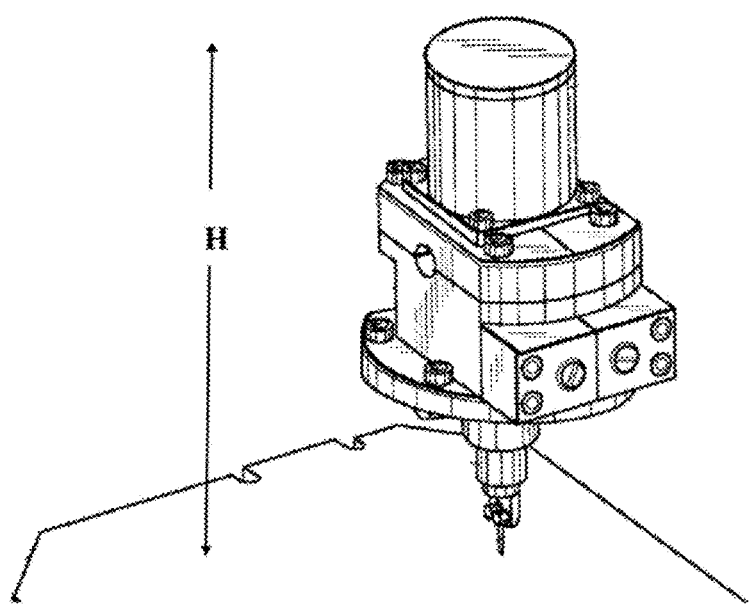
FIG. 9: Prior art

TWO PROBE WAVEGUIDE TUNER

PRIORITY CLAIM

Not Applicable

CROSS-REFERENCE TO RELATED ARTICLES

1. "Load Pull Measurements" [online], Wikipedia [retrieved on Nov. 18, 2016] Retrieved from Internet <URL: http://en.wikipedia.org/wiki/Load_pull>
2. W Band Programmable Tuner Model 11075, PN-43, Focus Microwaves August 1997.
3. Tsironis C., U.S. Pat. No. 6,674,293, "Adaptable Pre-Matched Tuner System and Method".
4. Simpson et al., U.S. Pat. No. 5,910,754, "Reduced height waveguide tuner for impedance matching", FIG. 8.
5. "Signal-flow graph" [online], Wikipedia [retrieved on Aug. 31, 2021]. Retrieved from Internet <URL: https://en.wikipedia.org/wiki/Signal-flow_graph>.
6. "Linear Actuator" [online], Wikipedia [retrieved on Apr. 25, 2020]. Retrieved from Internet <URL: https://en.wikipedia.org/wiki/Linear actuator>.

BACKGROUND OF THE INVENTION

This invention relates to load and source pull testing of RF and millimeter-wave transistors and amplifiers using remotely controlled electro-mechanical waveguide impedance tuners.

A popular method for testing and characterizing RF and millimeter-wave transistors in their non-linear region of operation is "load pull" (see ref. 1). Load pull is a device measurement technique employing microwave impedance (load-pull) tuners and other microwave test equipment as shown in FIG. 1. The waveguide tuners 2, 4 (see ref. 2) are used in order to manipulate the microwave impedance conditions under which the Device Under Test (DUT, or transistor, 3) is tested; the test signal is provided by a signal source 1 and the out-coming power is measured by a power meter 5; the whole is controlled by a PC controller 6, which includes an electronic interface to communicate with the instruments 1, 5 and the tuners 2, 4 using digital control and communication cables 7, 8 and 9.

DESCRIPTION OF PRIOR ART

Waveguide impedance tuners include, in general, a low-loss transmission line 26, FIG. 2, and conductive tuning element (tuning probe, 20) inserted in a slot 28 machined into the waveguide 23; the probe 20 is a at least partly conductive rod, block or bar, is attached to a complex, adjustable high precision motor-controlled 25 vertical axis 22 and is inserted vertically into the slot 28 and moved 24 along the axis of the waveguide; this movement of the tuning probe creates, in a certain frequency range, a controllable variable reactance which, combined with the following matched load allows the synthesis of various impedances (or reflection factors) which are present at the test port 27, covering up to the quasi totality of the Smith chart (the polar impedance mapping display shown as normalized reflection factor, FIG. 3). The impedance synthesis follows a path 30, 31 between the matched load at the origin (50Ω) and an arbitrary target-1. Inserting the tuning probe into the slot follows path 30 and moving it along the slot follows path 31. The relation between reflection factor Γ and impedance Z is given by $\Gamma=(Z-Zo)/(Z+Zo)$, wherein $Z=R+jX$ and wherein Zo is the characteristic impedance. A typical value used for Zo is 50Ω.

When conductive tuning probes (typically rods) 20, FIG. 2, penetrate into the waveguide 26, they capture and deform the electric field, which is concentrated in the area 29 between the bottom tip of the probe 20 and the ground plane 23 of the waveguide. This field deformation creates a capacitive effect send injected signal power back and allows generating high and controllable reflection factors. The main disadvantage of this embodiment is the requirement for high precision and resolution and, by consequence, tall and cumbersome vertical probe movement mechanisms 22, see FIG. 9 and ref. 4, precise over their entire travel range and able to fully insert or extract the tuning probe from the waveguide cavity, since the significant portion of reflection occurs when the probe tip is very close to the bottom inner wall of the waveguide (ground plane). This movement process slows down the tuning procedure for two reasons: (a) when the probe is withdrawn, the vertical movement is lengthy and much less effective in terms of generating useful reflection factor, and (b), because the vertical moving resolution is constant, enhanced positioning accuracy and resolution are required all the way due to high tuning sensitivity in the high reflection area, when the probe is deeply inserted and close to the ground plane.

Related prior art (see ref. 3) does not teach impedance tuners with fixed penetration (or vertical position) dual tuning probes; prior art tuners require at least one high precision complex vertical axis to be able to create path 30 in FIG. 3 and tune. Neither relevant prior art ref. 3 or 4 teach a compact tuner using alternatively swapping and crossing over tuning probes in a shared transmission line structure. This overlapping structure, though, is essential and compatible with the proposed low profile, compact size tuner and attractive, because of high-speed adaptive tuner calibration and operation (see ref. 3).

BRIEF SUMMARY OF THE INVENTION

The invention discloses a new type waveguide load pull slide screw tuner. The tuner configuration, different from prior art, uses horizontal-only high-speed movement techniques of the tuning probes.

The impedance tuner itself, of which a conceptual cross section is shown in FIG. 4, uses a low loss waveguide transmission line 40 and two diametrical tuning probes 42. The tuning probes 42 are, typically, at least partially conductive rods and are mounted on mobile sliding carriages 45. The carriages are placed facing each-other across the waveguide and slide 43 seamlessly and precisely along the waveguide top and bottom walls guided by high precision sliders. They hold the tuning probes (conductive rods) 42 and keep them inserted into the waveguide cavity at a fixed depth through vertical slots 46, non-contacting with the slot walls 21. The slots run parallel to the axis of the waveguide. This tuning mechanism does not require any vertical probe control. In order to allow the tuning rods to cross over without mechanical conflict, the slots are slightly offset of the center line of the waveguide, by at least one diameter (thickness) of a tuning rod. A medium size reflection ($S11 \approx 0.5$-$0.7$) is created by either tuning rod leading to a different tuning mechanism as shown in FIG. 3 (traces 32, 33). Both tuning mechanisms shown in FIG. 3 yield the same result: starting from the matched load (50Ω) they allow tuning to targets-1 or -2. The result is the same, only the control mechanisms differ.

The carriages 45, 52, 53 are controlled using high-speed electric stepper motors 54 and ACME rods 51 or actuators (see ref. 6) thus eliminating this way additional control gear. Last, not least, the tuning mechanism, liberated from cumbersome and expensive high resolution vertical probe control and movement delays, benefits also from inherent lower tuning error sensitivity to mechanical probe positioning tolerances close to |Γ|≈1.

BRIEF DESCRIPTION OF THE SEVERAL VIEWS OF THE DRAWINGS

The invention and its mode of operation will be better understood from the following detailed description when read with the appended drawings, in which:

FIG. 2A depicts a front view of the entire tuner; FIG. 2B depicts a cross section of the tuning probe (typically a conductive rod) entering the waveguide slot.

FIG. 6A depicts the reflection area of a tuning probe; FIG. 6B depicts the overall signal flow graph; FIG. 6C identifies the signal transmission and nodes of the tuner depicted in the signal flow graph.

FIG. 9 depicts prior art: vertical axis of waveguide slide screw tuner.

DETAILED DESCRIPTION OF THE INVENTION

Figure 1:
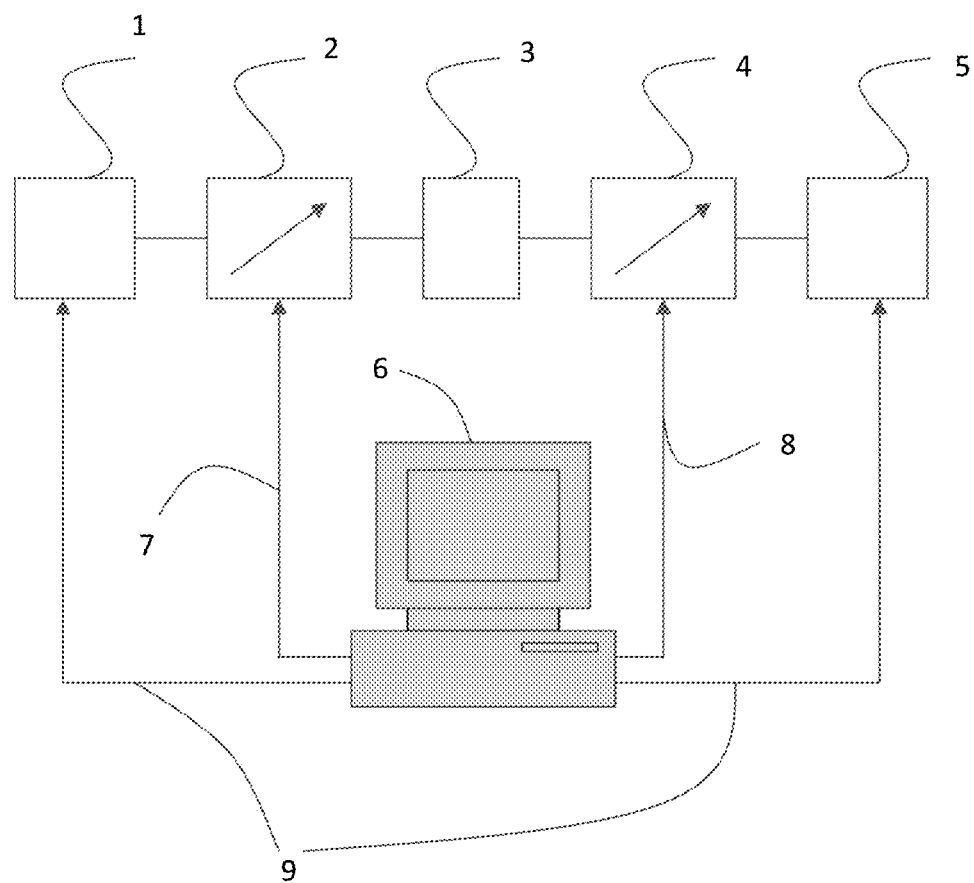
FIG. 1 depicts prior art: a typical generic automated load pull test system.
Figure 2:
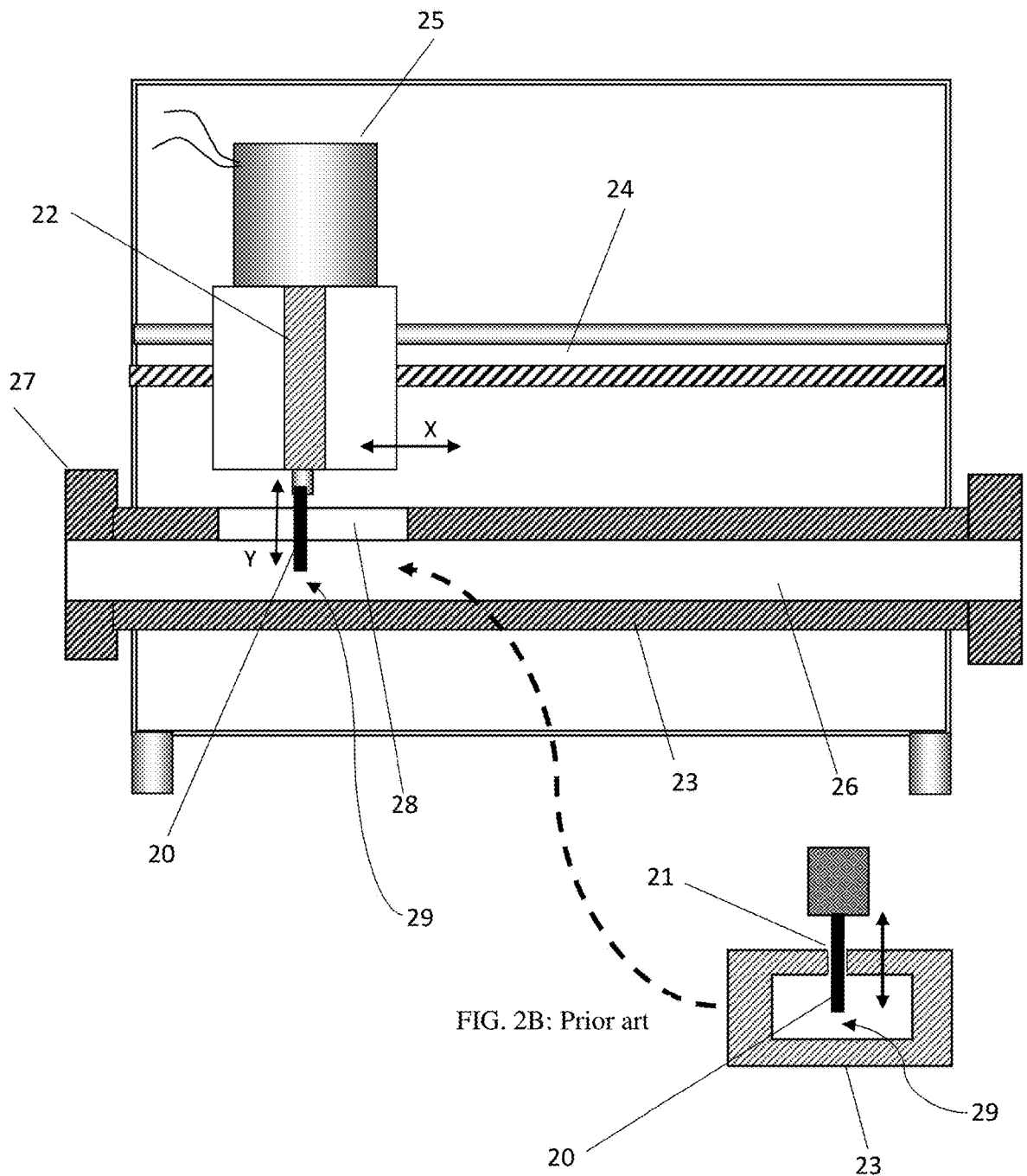
FIGS. 2A through 2B depict prior art: a single probe waveguide impedance tuner.
Figure 3:
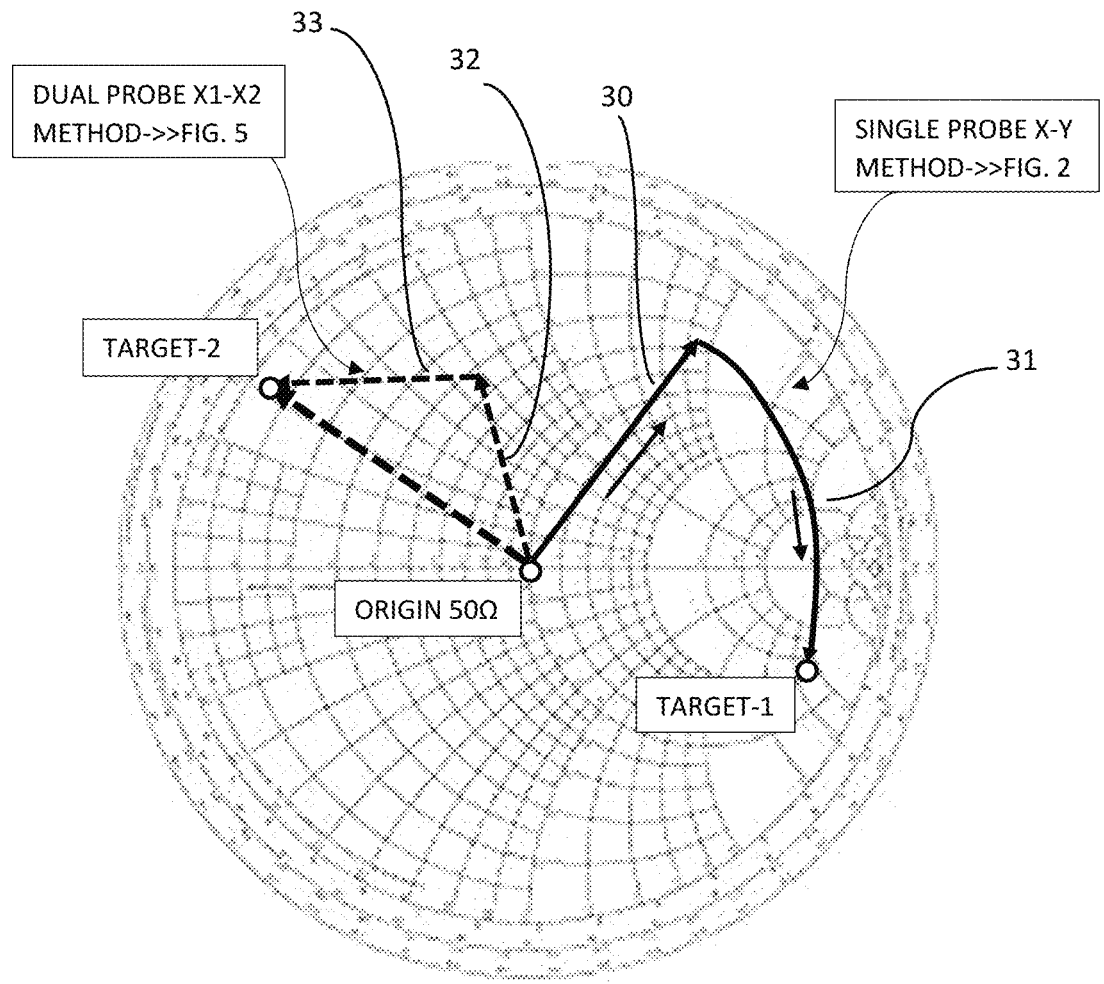
FIG. 3 depicts partly prior art: a Smith chart and two possible trajectories of impedance synthesis (tuning) to reach a target impedance starting from the origin of 50Ω. Reaching target-1 uses the prior art single-probe technique with horizontal and vertical control; reaching target-2 uses the new two-probe technique with horizontal only and without vertical control.

This invention discloses a high frequency (RF, microwave, millimeter wave), computer-controlled impedance tuner, suitable for load pull measurements. The tuner (FIGS. 4 and 5) uses a low loss waveguide transmission airline 40, which includes two broad top walls, two narrow sidewalls and two slots 46 cut into the broad walls, one on the top and one on the bottom. The slots run parallel to the waveguide longitudinal axis and are positioned opposite to each other and slightly offset from the symmetry center line of the waveguide. The offset eccentricity is selected to allow two tuning probes (typically metallic or metallized rods 42) to cross over (pass next to each other) without touching. This structure is chosen for economy of space, because it uses slots of a total length of one half of a wavelength 56 plus the thickness of one tuning rod. An alternative configuration, where the tuning rods would not cross over, would, in principle, also work, but the slot (and the tuner) would have to be twice as long. The horizontal control of the carriages 52 and 53 can be made using stepper motors 54 and ACME screws 51, but can also be accomplished using linear electric actuators (see ref. 6), instead of motors 54 and ACME screws. The actuators have a motorized body, and their rotor axis is the extended horizontal ACME screw 51.

Figure 4:
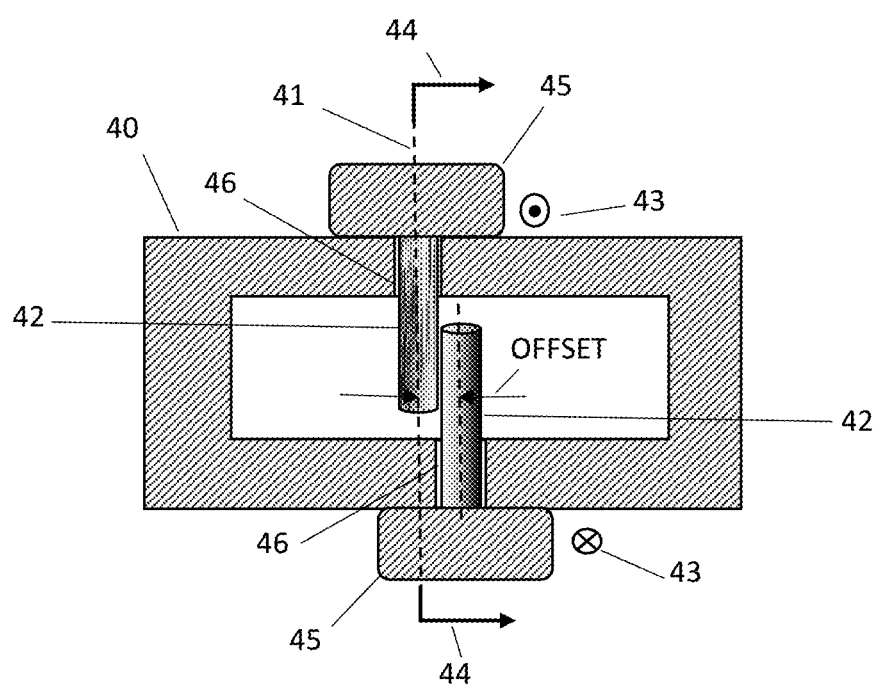
FIG. 4 depicts a cross-section through a waveguide with two conductive tuning rods (probes) entering from opposite sides into slightly offset slots.
Figure 5:
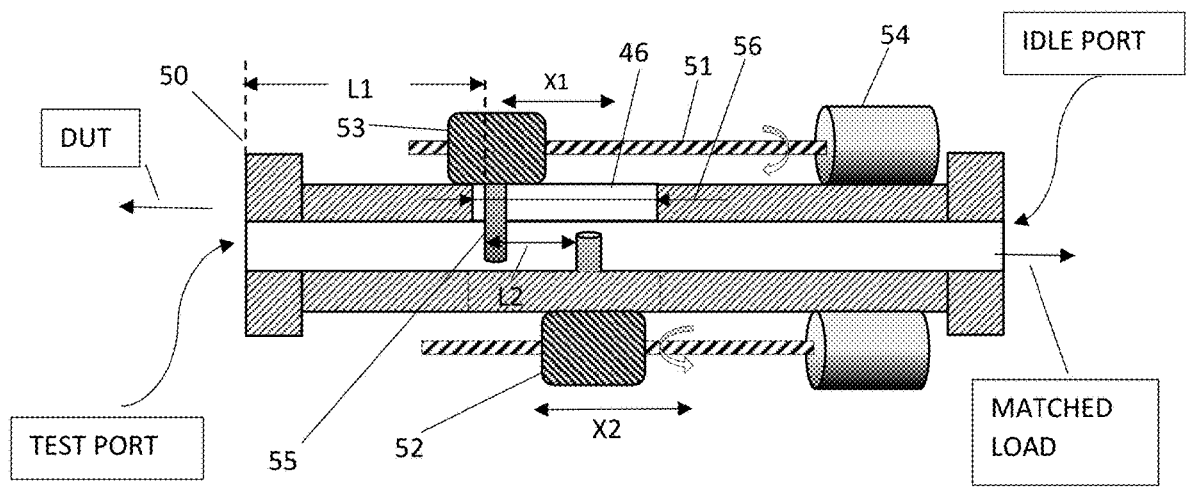
FIG. 5 depicts a front view of the waveguide tuner with two crossing over tuning probes.

FIG. 5 shows a front view of the waveguide tuner created by the cross section 41, 44 of FIG. 4: the slots 46 can be seen and their effective length as well 56; the mobile carriages 52 and 53 are controlled by the ACME screw 51 along the waveguide via the stepper motors 54; the reference position of carriage 53 is X1 and of carriage 52 is X2 relative to a common arbitrary zero position. The electric distance of the first tuning rod 55 from the test port 50 is L1 and the electric distance between the two tuning rods is L2; the lower slot 46 is hidden in FIG. 5 as it is evident from the cross section 44 in FIG. 4.

Figure 6:
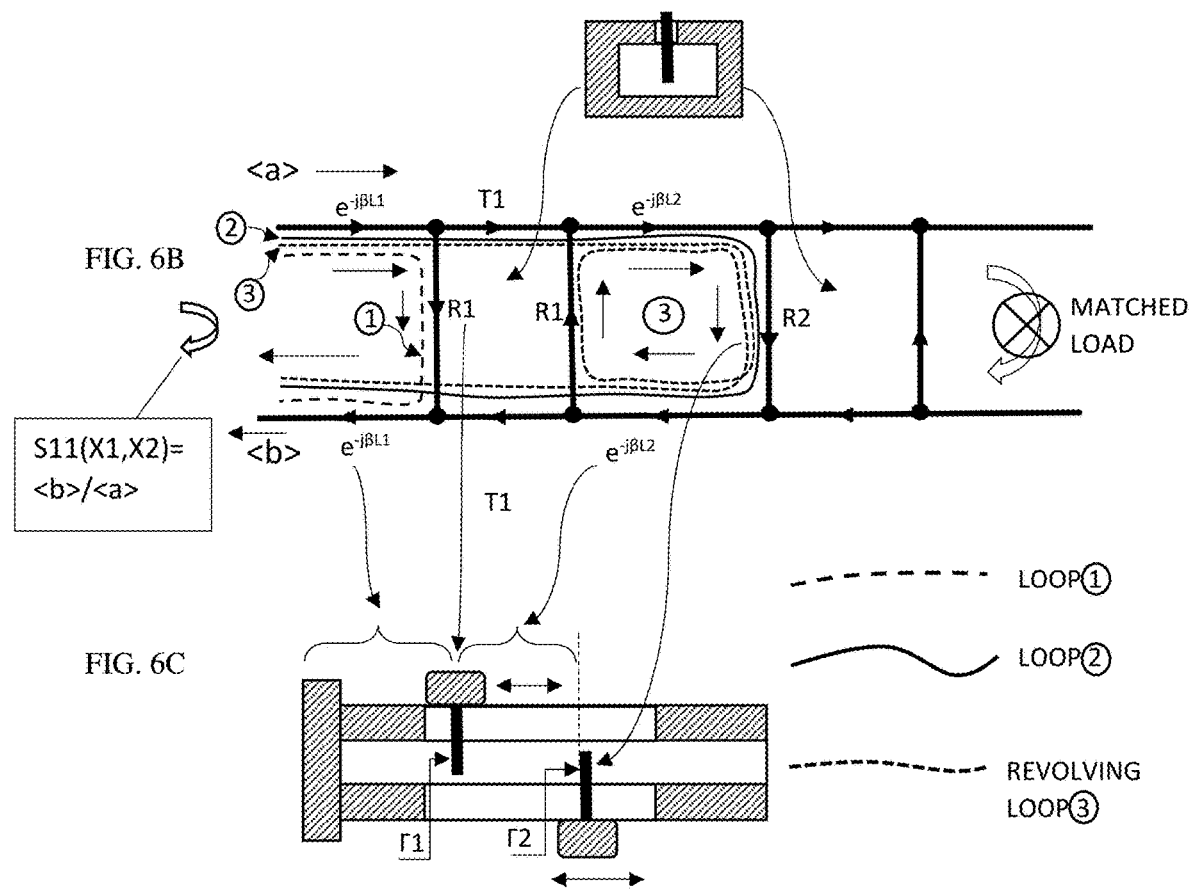
FIGS. 6A through 6C depict the signal flow graph (SFG) of the two-probe impedance tuner.
Figure 7:
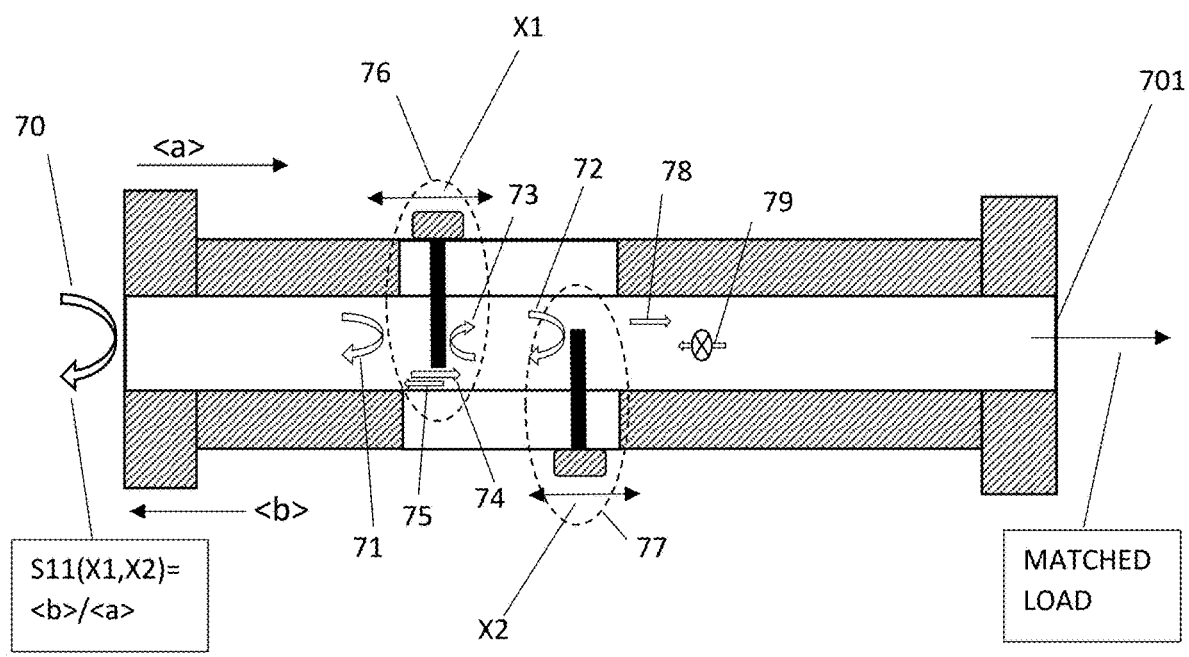
FIG. 7 depicts signal flow and multiple reflections created by the two probes of a two-probe impedance tuner with shared waveguide. The probes can swap positions with regard to the test port 70.

The signal propagation trajectories are shown in FIG. 6B supported by FIGS. 6A and 6C; the total reflection factor 70 is the sum of all internal reflections in the waveguide and a function of the positions X1 and X2 of the two probes: S11(X1,X2) and is the vector-sum of the reflection factors 71 and 75 of both probes S11(X1) and S11(X2): S11(X1, X2)=S11(X1)+S11(X2), all referenced at the test port 70. The tuning probe 76 closest to the test port generates the primary reflection 71 i.e., S11(X1). Since the reflection of the first probe 76 is selected not to be total S11(X1)≈0.5-0.7, there is a signal portion 74 traversing towards the secondary probe 77; this signal portion is then reflected back 72 towards the primary probe 76; again, a portion 75 of this reflected back signal traverses the primary probe towards the test port and adds to the total reflection 70. The signal 72 reflected at the secondary probe is also reflected back 73 at the primary probe, and so on . . . creating the phenomenon of a multiple reflection. In mechanical terms this appears like a turbulence. This back and forth bouncing of signal is well described using signal flow graphs (see ref. 5). Instead, since the tuner is terminated 701 with a matched load any escaping signal 78 is not reflected back 79 and therefore ignored.

FIG. 6B shows the signal flow graph describing the tuner, which is also shown schematically in FIG. 6C: Each node represents a port and each branch the complex signal flow factor S11 or S21 between nodes; each tuning probe (FIG. 6A) is described by a two-port having a reflection factor R (S11=S22) and a transmission factor T (S21=S12): probe 1 has R1 and T1, probe 2 has R2 and T2. The injected signal <a> returns as <b> after following several loops: between each probe there is a delay exp(−jβL); loop 1 represents the primary reflection, loop 2 the secondary reflection and loop 3 the multiple reflections; it must be remarked that loop 3 is revolving (repeating) adding each time a decreasing amount to the total reflection 70; loop 3 resumes in an infinite, but rapidly converging, series of reflected signal power vectors generating the overall reflection vector 70. The transmission factors T1 and T2 represent the portion of signal traversing the tuning probe, whereas the reflection factors R1 and R2 represent the reflected portion. Transmission lines are described by simple phase delays $\beta1=2\pi L1/\lambda$ or $\beta2=2\pi L2/\lambda$. Assuming the probes represent capacitors C1 and C2 then we can approximate: $R1=-j\omega C1Zo/(2+j\omega C1Zo)$; $R2=-j\omega C2Zo/(2+j\omega C1Zo)$; $T1=2/(j\omega C1Zo)$ and $T2=2/(2+j\omega C2Zo)$. The section after probe 2 is 50Ω matched, therefore signal is not returning and the associated R2 and T2 are ignored. By generating the signal loops 1, 2, 3, . . . which contribute to the overall reflected signal <b> we obtain for the reflection factor at the test port:

$$S11=<b>/<a>\approx\{e^{-j2\beta L1}-R1-e^{-j2\beta(L1+L2)})\neq R2\cdot T1^2-e^{-j2\beta(L1+2\ L2)}\cdot T1^2 R2^2 \cdot R1+\ldots\} \quad [\text{eq. 1}]$$

the series of loops is truncated, since the third loop (LOOP 3) is repeated n times with n=1, 2, 3, 4 . . . towards infinite, but its contribution to the total reflection factor at the test port is rapidly decreasing, since all s-parameters R (reflection) and T (transmission) and their products appearing at higher power $T1^{4n}$, $R1^{2n}$, $R2^{4n}$ etc. are smaller than 1, forming this way a converging infinite series with finite sum. The transmission between the test port 70, probe 1, 73 and probe 2, 77 is described by lossless transmission lines having a phase $-2\ \pi L/\lambda$, where $\lambda$ is the wavelength $\lambda=300$ mm/Frequency (GHz).

Figure 8:
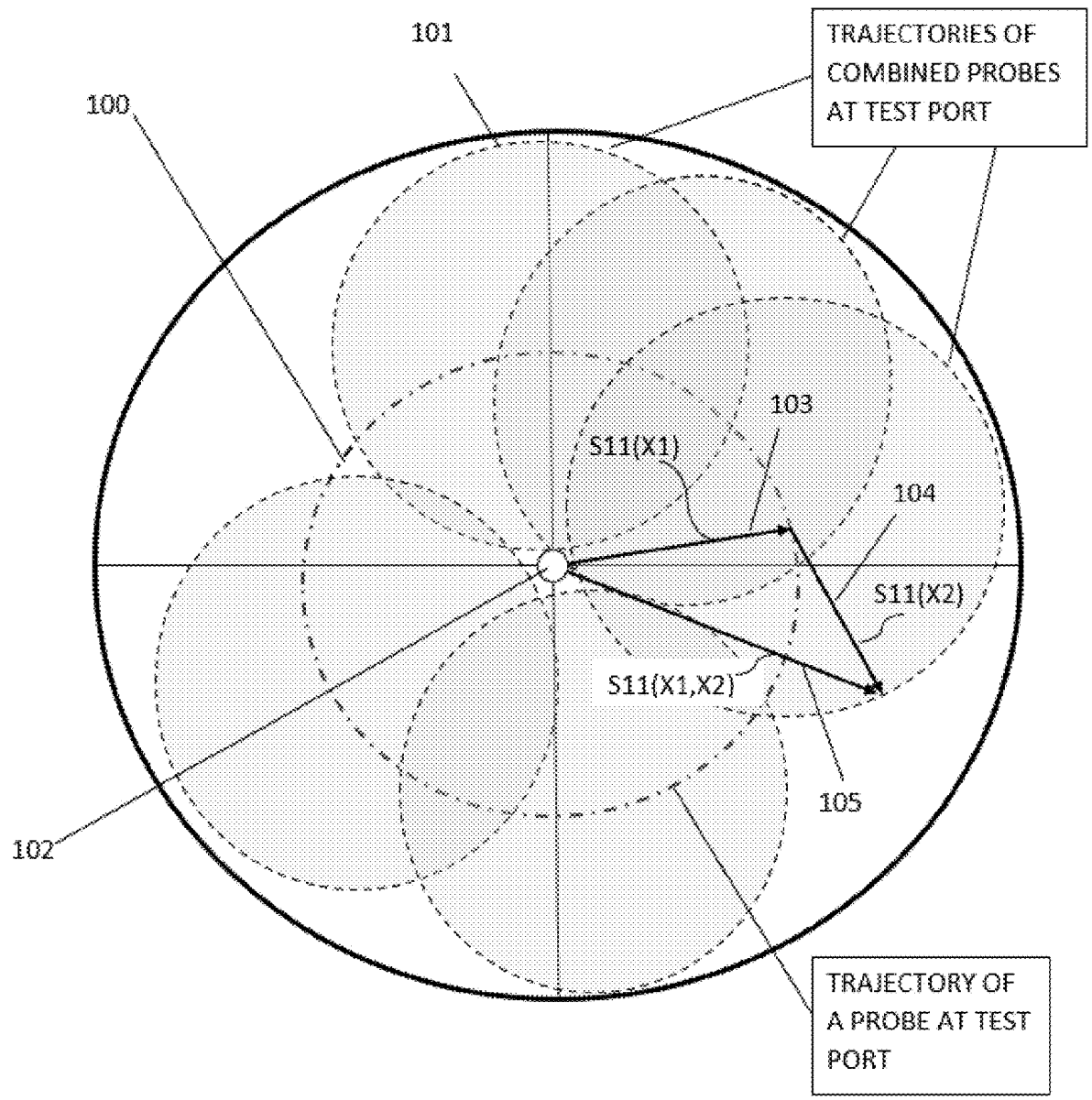
FIG. 8 depicts the Smith chart coverage mechanism using two-probe impedance tuner with fixed probe insertion depth.

FIG. 8 depicts schematically the overall reflection factor synthesis mechanism: each probe creates at its own reference plane Γ1 or Γ2 (FIG. 6C) concentric reflection factor circles represented at test port reference plane as trace 100 on the Smith chart (FIG. 8). The total reflection factor trace 101 is created by a planetary epicycloid superposition of the two reflection factor vectors around the center 102 (one circle rotates around a point at the periphery of the other). When the probes cross over the circles swap. The total reflection factor vector 105 is created by the vector sum of vector 103 (from the first probe) and the vector 104 (from the second vector) as described in equation 1.

Obvious alternative embodiments of fixed penetration tuning probes, diametrically inserted into and sharing the same slabline of waveguide slide screw impedance tuners and associated calibration and tuning methods shall not impede on the core idea of the present invention.

What is claimed is:

1. An automated two-probe waveguide slide screw tuner comprising:
   a waveguide transmission line, having
      two broad walls, a top broad wall, and a bottom broad wall, and two narrow side-walls,
      an input port and an output port,
      two slots parallel to a longitudinal axis of the waveguide transmission line placed facing each-other on the top and the bottom broad walls,
      two remotely controlled mobile carriages C #1 and C #2, mounted opposite to each-other on the top and bottom broad walls, sliding along the waveguide transmission line and holding associated tuning probes P #1 and P #2, which are inserted in the slots sharing the waveguide transmission line;
   wherein
   the slots are positioned offset of a center line of the waveguide transmission line by at least a thickness of the tuning probes,
   and wherein
   the tuning probes are inserted diametrical into the slots at a fixed penetration into the waveguide transmission line,
   and wherein
   carriage C #1 moves probe P #1 to a position X1, and carriage C #2 moves probe P #2 to a position X2.

2. The slide screw tuner of claim 1,
wherein
   the slots are at least one half of a wavelength ($\lambda$/2) long at a minimum operation frequency (Fmin).

3. The slide screw tuner of claim 1,
wherein
   the carriages are controlled by remotely controlled stepper motors and appropriate gear.

4. The slide screw tuner of claim 1,
wherein
   the tuning probes are metallic or at least partly metallized rods.

5. The slide screw tuner of claim 1,
wherein
   the tuning probes are metallic or at least partly metallized blocks.

6. The slide screw tuner of claim 1,
wherein
   the tuning probes traverse the slots in a contactless manner.

\* \* \* \* \*